United States Patent
Takenaka et al.

(10) Patent No.: US 6,342,729 B1
(45) Date of Patent: *Jan. 29, 2002

(54) TAPE CARRIER PACKAGE

(75) Inventors: Masashi Takenaka; Shiro Yoda; Junichiro Hiyoshi; Hiroshi Takahashi; Hideo Sato, all of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/343,262

(22) Filed: Jun. 30, 1999

(30) Foreign Application Priority Data

Nov. 20, 1998 (JP) .......................................... 10-331567

(51) Int. Cl.⁷ ............................................. H01L 23/495
(52) U.S. Cl. ......................... 257/669; 257/670; 257/674
(58) Field of Search ................................. 257/669, 670, 257/674

(56) References Cited

U.S. PATENT DOCUMENTS 5,281,851 A * 1/1994 Mills et al. .................. 257/670
5,925,926 A * 7/1999 Watanabe et al. ........... 257/668

FOREIGN PATENT DOCUMENTS

| JP | 62-113459 | 5/1987 |
| JP | 4-329649 | 11/1992 |
| JP | 5-21514 | 1/1993 |
| JP | 8078482 | * 3/1996 |
| JP | 9326414 | * 12/1997 |

* cited by examiner

*Primary Examiner*—Terry D. Cunningham
*Assistant Examiner*—Quan Tra
(74) *Attorney, Agent, or Firm*—Armstrong, Westerman, Hattori, McLeland & Naughton, LLP

(57) ABSTRACT

A tape carrier package formed by a TAB technique is provided. This tape carrier package includes a semiconductor chip and a TAB tape. The TAB tape has a rectangular device hole in which the semiconductor chip is situated, and inner leads extending inward in the device hole and bonded to the electrode bumps of the semiconductor chip. The inner leads (corner leads) at each corner of the device holes are reinforced by reinforcing leads.

5 Claims, 3 Drawing Sheets

TAPE CARRIER PACKAGE

BACKGROUND OF THE INVENTION

1. Field of the Invention

The present invention generally relates to tape carrier package, and more particularly to a ape carrier package formed by a TAB (Tape Automated Bonding) technique.

2. Description of the Related Art

In recent years, higher-density semiconductor chips have been developed at speed, and various packages for mounting such semiconductor chips have been introduced.

Among those packages, a tape carrier package utilizing the TAB technique is known. In such a tape carrier package, the intervals between the terminals of inner leads formed on the base film can be narrow so that the tape carrier package can be compatible with a high-density semiconductor chip. As the bumps (electrodes) provided to the semiconductor chip are collectively bonded to the inner leads, the production efficiency can be improved.

FIG. 1 illustrates a conventional tape carrier package 1. The tape carrier package 1 comprises a semiconductor chip 2 and a TAB tape 3. The semiconductor chip 2 has a high density, and is provided with electrode bumps 4 as outer connecting terminals on a surface on which a circuit (not shown) is formed. The TAB tape 3 has a base film 5 made of resin. This base film 5 is provided with sprocket holes 6, a device hole 7, a solder resist 8, electrode pads 9, and inner leads 10.

The sprocket holes 6 are used for transporting the TAB tape 3 in the direction (indicated by arrow Y in the figure), and formed on each side rim of the base film 5. The device hole 7 is a rectangular opening formed in the center of the base film in the width direction (indicated by arrow X in the figure). The semiconductor chip 2 is inserted into the device hole 7.

The solder resist 8 is formed on the outer periphery of the device hole to protect electrode pads and a wiring pattern. The electrode pads connected to outer connecting terminals (ball bumps, for instance) are formed in the region of the solder resist 8.

The base film 5 is provided with a wiring pattern (not shown). One side of the wiring pattern is connected to the electrode pads 9, while the other side is exposed from the solder resist 8 to form the inner leads 10.

The inner leads 10 are arranged at the same intervals as the intervals at which the electrode bumps 4 are provided to the semiconductor chip 2. The inner leads 20 extend inward in the device hole 7. The electrode bumps 4 of the semiconductor chip 2 are collectively bonded to the inner leads 10 by heat compressing, so that the semiconductor chip 2 and the electrode pads 9 (the outer connecting terminals) are electrically connected.

After the semiconductor chip 2 is bonded to the TAB tape 3, the tape carrier package 1 is transported by sprockets (not shown) engaged with the sprocket holes 6, wound up by a reel, and sent to another process.

Since the base film 5 of the TAB tape 3 is flexible, the tension during transportation stresses the inner leads 10. The stress is applied to the inner leads in the neighborhoods of the corners 11 of the device hole 7. Also, the high density of the semiconductor chip 2 makes the inner leads 10 smaller and weaker.

With the conventional tape carrier package 1, there has been a problem that the inner leads 10 in the neighborhoods of the corners 11 are deformed or cut off by the stress applied during transportation.

The same problem may arise when a heating test such as burn-in test is conducted. Since the semiconductor chip 2 and the base film 5 are different in thermal expansion coefficient, there is a thermal expansion difference between the semiconductor chip 2 and the base film 5. This thermal expansion difference results in stress on the inner leads 10 in the neighborhoods of the corners 11. Because of this, the inner leads 10 are deformed or cut off during the test.

SUMMARY OF THE INVENTION

The principal object of the present invention is to provide a tape carrier package which can prevent the inner leads from being deformed or cut off even if stress is applied to the inner leads during transportation.

The object of the present invention is achieved by a tape carrier package which includes a semiconductor chip, a film-type member, and reinforcing members. The film-type member has a rectangular device hole formed in a position where the semiconductor chip is situated, and inner leads extending inward in the device hole and bonded to the electrodes of the semiconductor chip. The reinforcing members connect the inner leads at each corner of the device hole, and are integrally formed with the inner leads.

As the reinforcing members reinforce the inner leads at each of the corners, to which excessive stress is applied, to prevent the inner leads from being deformed or cur off. By doing so, the reliability and yield of the tape carrier package can be improved.

The above and other objects and features of the present invention will become more apparent from the following description taken in conjunction with the accompanying drawings.

DESCRIPTION OF THE PREFERRED EMBODIMENTS

The following is a description of one embodiment of the present invention, with reference to the accompanying drawings.

Figure 1:
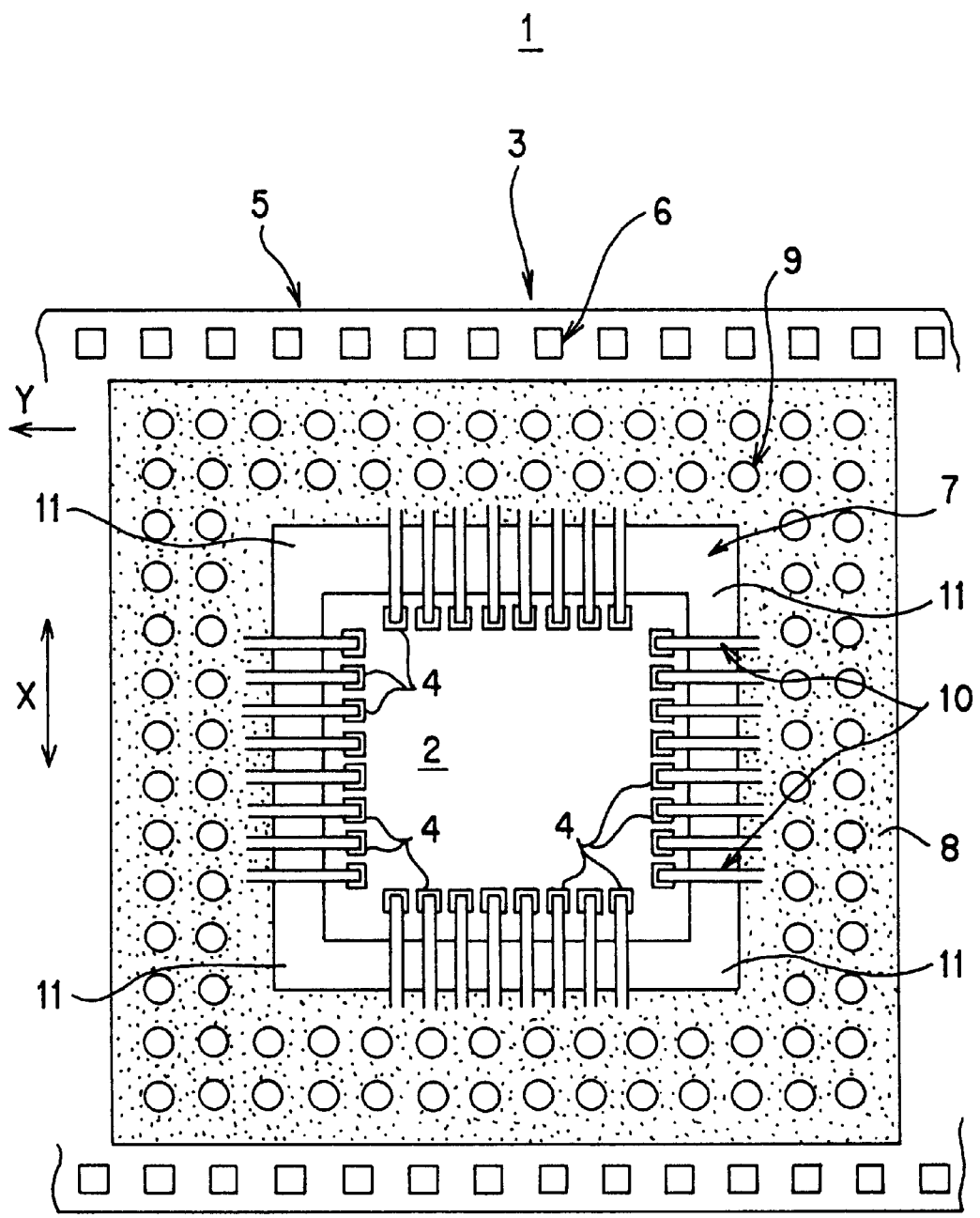
FIG. 1 is a schematic view of a conventional tape carrier package.
Figure 2:
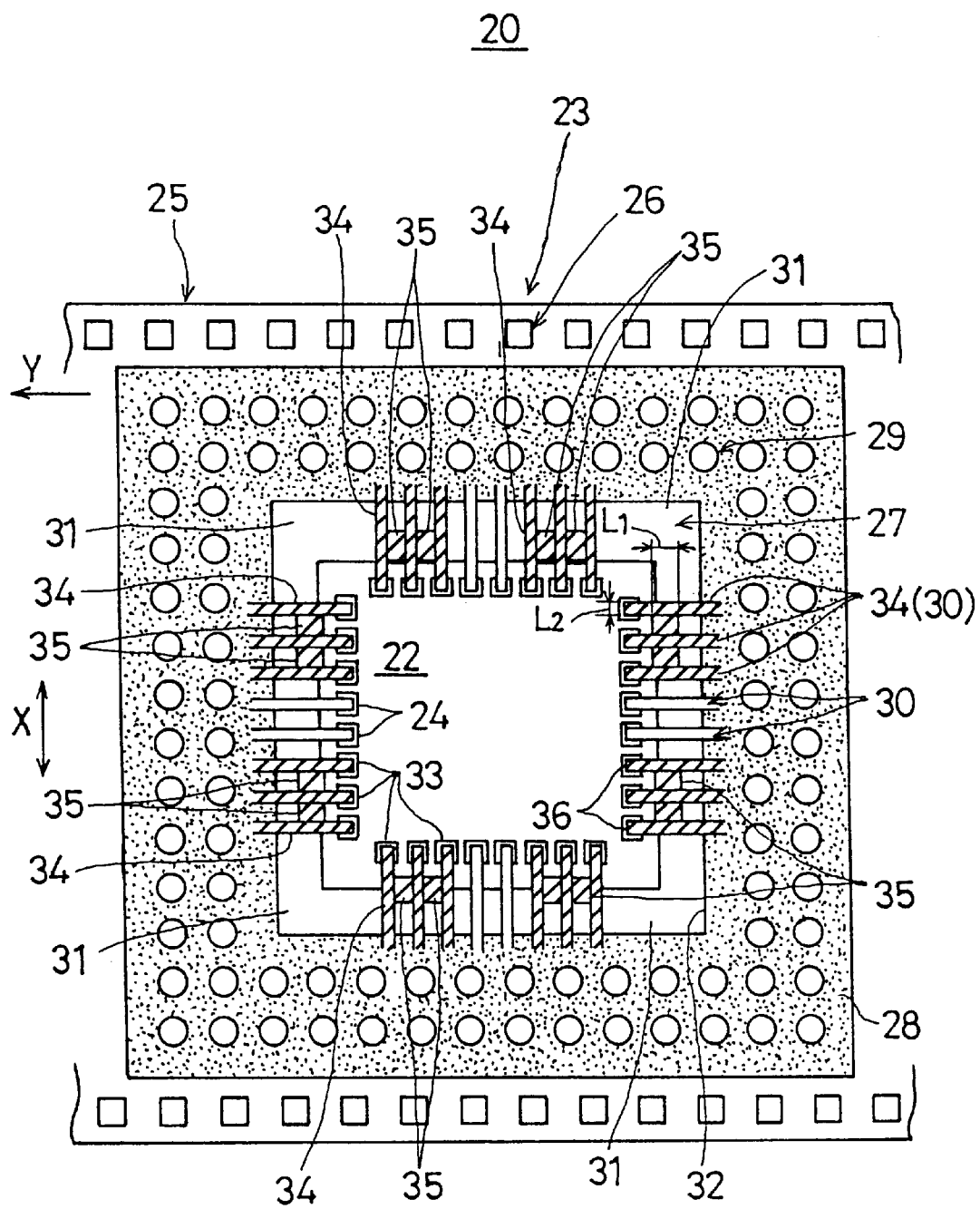
FIG. 2 is a schematic view of one embodiment of the tape carrier package of the present invention.

FIG. 2 is a schematic view of a tape carrier package 20 of one embodiment of the present invention. The tape carrier package 20 comprises a semiconductor chip 22 and a TAB tape 23.

The semiconductor chip 22 has a high density, and a plurality of electrode bumps 24 and dummy bumps 33 are disposed on a surface on which a circuit (not shown) is formed. The electrode bumps 24 are provided to electrodes for receiving signals and supplying electric power for the semiconductor chip 22. The dummy bumps 33 are provided to electrodes (dummy electrodes) not involved in receiving signals and supplying electric power for the semiconductor chip 22. A plurality of dummy bumps 33 (three in this embodiment) are formed in the vicinity of each of the four corners of the rectangular semiconductor chip 22.

The TAB tape 23 has sprocket holes 26, a device hole 27, a solder resist 28, electrode pads 29, and inner leads 30, all of which are formed on a base film 25.

The base film 25 is made of a resin such as polyimide to possess flexibility. Although an area of the base film 25 only equivalent to one tape carrier package 20 is shown in FIG. 2, the base film extends horizontally in the figure, so that a plurality of tape carrier packages 20 can be formed on the TAB tape 23.

Each of the sprocket holes 26 is a small rectangular hole formed at uniform intervals in the vicinity of each side rim of the base film 25. The sprocket holes 26 are used in transportation of the base film 25 (or the TAB tape 23). The sprocket holes 26 are meshed with sprockets for transportation (not shown), and the sprockets rotate to transport the base film 25, for instance, in a direction indicated by arrow Y in the figure.

When the base film 25 is transported, procedures for producing the tape carrier package 20 are carried out. After the tape carrier package 20 is completed, the base film 25 (the TAB tape 23) is wound up by a reel, and other procedures such as packaging procedures are performed.

The device hole 27 is a rectangular opening formed in the center of the base film 25 in its width direction indicated by arrow X in the figure. The semiconductor chip 22 is inserted into the device hole 27.

The solder resist 28 is formed around the outer periphery of the device hole 27 in the base film 25. The solder resist 28 protects the electrode pads 29 and a wiring pattern. The electrode pads 29 connected to the outer connecting terminals (ball bumps, for instance) are formed in the region of the solder resist 28.

The base film 25 is provided with a wiring pattern (situated on the lower layer of the solder resist 28) made of copper foil, for instance. The electrode pads 29 are formed on one side of the base film 25, while the inner leads 30 are formed on the other side. Here, the wiring pattern, the electrode pads 29, the inner leads 30 are integrally formed. The electrode pads 29 and the inner leads 30 are exposed from the solder resist 28. The exposed areas of the electrode pads and the inner leads 30 are plated to improve the bond between solder balls and the semiconductor chip 22.

The inner leads 30 extend toward the inside of the device hold 27, and surround the device hole 27. There are two types of inner lead. The inner leads of one type are formed in positions except the neighborhoods of the four corners 31 of the rectangular device hole 27, while the inner leads of the other type are formed in the neighborhoods of the four corners 31 of the rectangular device hole 27.

Hereinafter, the inner leads formed in the positions except the neighborhoods of the four corners 31 of the device hole 27 will be referred to as inner leads 30, and the inner leads formed in the neighborhoods of the four corners 31 of the device hole 27 will be referred to as corner leads 30.

The positions of the inner leads 30 correspond to the positions of the electrode bumps 24 provided to the semiconductor chip 22. The positions of the corner leads 30 correspond to the positions of the dummy pads 33 provided to the semiconductor chip 22.

Each of the intervals between the inner leads 30 and the corner leads 30 is equal to each of the intervals between the electrode bumps 24 and the dummy bumps 33. The electrode bumps 24 and the dummy bumps 33 provided to the semiconductor chip 22 are collectively bonded to the inner leads 30 and the corner leads 30 by heat compression.

In the above manner, the electrode bumps 24 and the dummy bumps 33 on the semiconductor chip 22 are electrically connected to the electrode pads 29 (the outer connecting terminals) via the inner leads 30, the corner leads 30, and the wiring pattern. As described above, the dummy pads 33 are not involved in receiving signals and supplying electric power in this embodiment. Therefore, the dummy pads 33 may not be connected to the electrode pads 29 and the wiring pattern.

In the tape carrier package 20, the stress applied during the transportation or during the heating operation deforms or cuts off the inner leads (the corner leads 34) in the neighborhoods of the corners 31 of the device hole 27.

In the tape carrier package 20 of this embodiment, the corner leads 34 in each corner 31 of the rectangular device hole 27 are connected by reinforcing leads 35 (reinforcing members).

The reinforcing leads 35 may be formed integrally with the corner leads 34, or the reinforcing leads 35 may be provided after the corner leads 34 are formed.

In the case where the reinforcing leads 35 and the corner leads 34 are integrally formed, the production procedures can be simplified. In the case where he reinforcing leads 35 and the corner leads 34 are separately formed, a material having high strength can be chosen for the reinforcing leads 35 regardless of the material of the corner leads 34, thereby obtaining high reinforcing strength.

As described above, the reinforcing leads 35 provided to the corner leads 34 at the corners 31 reinforce the corner leads 34, which are subjected to stress during transportation and a heating operation. Thus, the corner leads 34 can be prevented from being cut off or deformed, and the inner leads 30 for receiving signals can be protected. In this manner, the reliability and yield of the tape carrier package is improved.

As for the positions of the reinforcing leads 35, the reinforcing leads 35 are disposed between the edge 36 of the corner leads 34 in the device hole 27 and the rim 32 of the device hole 27. As shown in FIG. 2, the reinforcing members are disposed between each pair of adjacent inner leads. The corner leads 34 extend inward in the device hole 27, and are relatively weak without being supported by the base film 25. The reinforcing leads 35 can surely prevent the weak corner leads 34 from being cut off or deformed.

As for the shape of each of the reinforcing leads 35 in this embodiment, the width of each of the corner leads 35 (indicated by arrow L1 in FIG. 2) is equal to or greater than the width of each of the corner leads 34 (indicated by arrow L2). The relationship between the widths is $L1 \geq L2$. By making the width L1 of the reinforcing leads 35 greater, the corner leads 34 can be surely reinforced, and the reliability of the tape carrier package 20 can be improved further.

In this embodiment, the corner leads 34 reinforced by the reinforcing leads 35 are bonded to the dummy bumps 33 not involved in receiving signals and supplying electric power for the semiconductor chip 22. Even if the corner leads 34 are subjected to excessive stress and damaged, the inner leads 30 for receiving signals remain connected to the electrode bumps 24. Thus, the reliability of the tape carrier package 20 (or the semiconductor chip 22) can be improved.

Although the corner leads 34 are bonded to the dummy bumps 33 not involved in receiving signals and supplying electric power for the semiconductor chip 22, electrode bumps for supplying electric power or earthing (hereinafter referred to as power bumps) may be provided at the corners of the semiconductor chip 22, and the corner leads 34 may be bonded to the power bumps. The semiconductor chip 22 is normally provided with a plurality of power electrodes (electric power or earthing electrodes). The power bumps can be collectively formed at the corners of the semiconductor chip 22.

By bonding the corner leads 34 to the power bumps formed at the corners of the semiconductor chip 22, the corner leads 34 provided with the reinforcing leads 35 can be used as power supply wires. The corner leads 34 bonded to the reinforcing leads 35 having conductivity have only small electrical resistance. In this structure, electric loss in the tape carrier package 20 can be prevented, thereby saving electric power.

FIGS. 3A to 3G illustrate various modifications of the reinforcing leads 35. In those figures, the same components as in FIG. 2 are indicated by the same reference numerals as well. Here, each reinforcing lead 35 reinforces four corner leads 34 (or the inner leads 30).

Figure 3A:
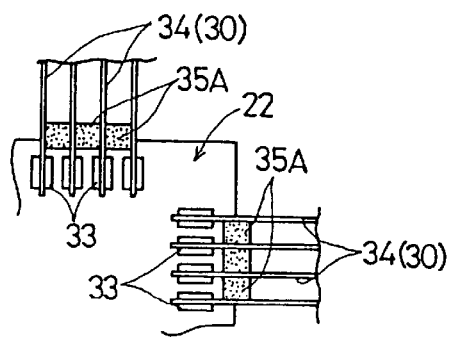
FIGS. 3A to 3G illustrate modifications of the reinforcing leads.

Each reinforcing lead 35A shown in FIG. 3A is partly situated on the upper surface of the semiconductor chip 22. Since the neighborhoods of the dummy bumps 33 provided to the semiconductor chip 22 are reinforced in this structure, the corner leads 34 can be prevented from separating from the dummy bumps 33 when stress is applied.

Figure 3B:
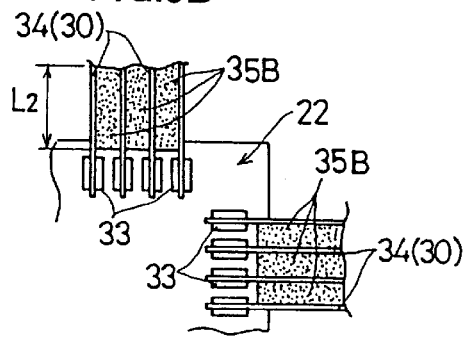

Each reinforcing lead 35B shown in FIG. 3B has a width L2 greater than the width L1 shown in FIG. 2. The wider the reinforcing leads 35, the more the corner leads 34 are reinforced. Thus, the reinforcing strength in this modification can be higher than in the embodiment shown in FIG. 2.

Figure 3C:
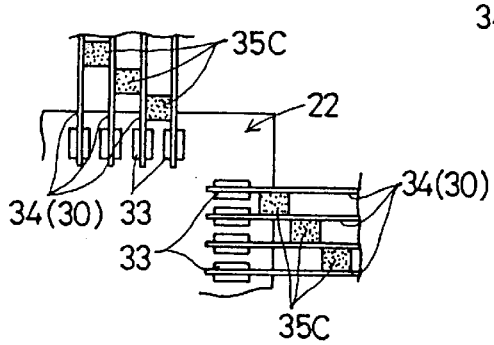

Reinforcing leads 35C shown in FIG. 3C are arranged in different positions from adjacent ones. The reinforcing leads 35C are not necessarily arranged in line, but adjacent reinforcing leads 35C can be situated in different positions. The irregular positions of the reinforcing leads 35C vary the rigidity between each pair of adjacent corner leads 34. By placing the reinforcing leads 35C in positions to which stress is applied during transportation or experiment, the corner leads 34 can be surely prevented from being deformed or cut off.

Figure 3D:
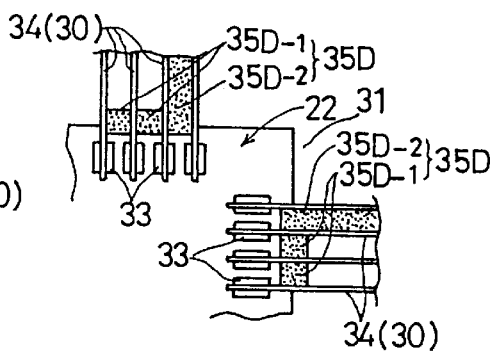

Each reinforcing lead 35C shown in FIG. 3D is made up of reinforcing leads 35C-1 and 35C-2 having different widths. The wider reinforcing lead 35C-2 is placed in the position closest to each corner 31, to which excessive stress is applied. In this structure, the stressed positions are firmly reinforced, so that the corner leads 34 can be surely prevented from being deformed or cut off.

Figure 3E:
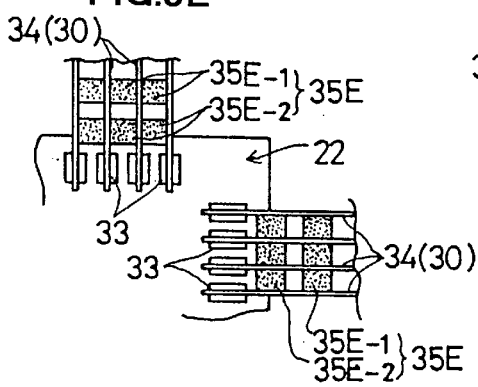

Each reinforcing lead 35E shown in FIG. 3E is made up of reinforcing lead members 35E-1 and 35E-2 (the number of reinforcing lead members is not limited to 2), and the reinforcing lead members 35E-1 and 35E-2 are disposed between adjacent corner leads 34. In this structure, each pair of adjacent corner leads 34 are reinforced at several points, so that the corner leads 34 can be surely prevented from being deformed or cut off.

Figure 3F:
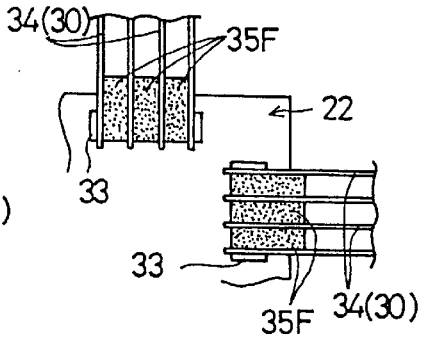

Each reinforcing lead 35F shown in FIG. 3F has a width greater than the width shown in FIG. 2, as in the modification shown in FIG. 3B. The reinforcing lead 35F covers the upper surface of the dummy bumps 33. In this structure, the dummy bumps 33 are bonded to both the corner leads 34 and the reinforcing leads 35F, thereby improving the bonding strength.

Figure 3G:
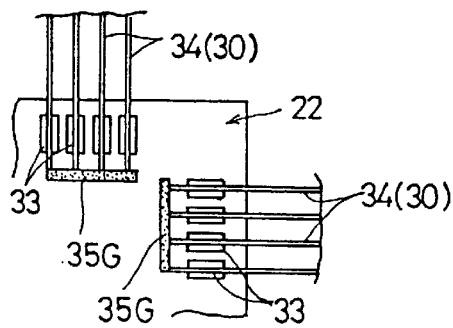

Reinforcing leads 35G shown in FIG. 3G are disposed at the edges of the corner leads 34. As shown in FIG. 3G, the positions of the reinforcing leads 35G are not limited to between the dummy bumps 33 and the hole rim 32 (shown in FIG. 2), and the reinforcing leads 35G can be formed on the semiconductor chip 22.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

The present application is based on Japanese priority application No. 10-331567, filed on Nov. 20, 1998, the entire contents of which are hereby incorporated by reference.

What is claimed is:

1. A tape carrier package comprising:

a semiconductor chip;

a film-type member having a device hole formed in a position where the semiconductor chip is situated, and parallel inner leads extending inward in the device hole and bonded to electrodes of the semiconductor chip; and reinforcing members for reinforcing the inner leads at each corner of the device hole, the reinforcing members being integrally formed with the inner leads, wherein the reinforcing members extend between and connect each pair of adjacent parallel inner leads at each corner of the device hole.

2. The tape carrier package according to claim 1, wherein a width of each of the reinforcing members in a longitudinal direction of the inner leads is equal to or greater than a width of each of the inner leads.

3. The tape carrier package according to claim 1, wherein the reinforcing members are formed between edges of the inner leads in the device hole and a rim of the film-type member.

4. The tape carrier package according to claim 1, wherein the inner leads provided with the reinforcing members are bonded to electrodes not involved in receiving signals and supplying electric power for the semiconductor chip.

5. The tape carrier package according to claim 1, wherein the inner leads provided with the reinforcing members are connected to power supply electrodes or ground electrodes of the semiconductor chip.

* * * * *